THICKNESS MONITOR FOR COATING SILICON WAFER

Filed March 3, 1967

INVENTOR.
ROLAND C.M. BEEH
J. O. Malone

United States Patent Office 3,492,491
Patented Jan. 27, 1970

3,492,491

THICKNESS MONITOR FOR COATING SILICON WAFER

Roland C. M. Beeh, Brentwood, N.Y., assignor to OPTOmechanisms, Inc., Plainview, N.Y.

Filed Mar. 3, 1967, Ser. No. 620,439
Int. Cl. H01j *39/12*
U.S. Cl. 250—222 6 Claims

ABSTRACT OF THE DISCLOSURE

Photoresist liquid is placed on a spinning silicon wafer drop by drop. The thickness of the layer is continuously measured with a laser and reflectance detector. The detector controls the spin speed with a servo motor, to control the thickness.

This invention relates to means for placing a controlled thickness layer of photoresist material on a silicon wafer.

In making micro circuits it is desired to print high resolution images which have been greatly demagnified, upon a layer of photoresist material which is placed on a silicon wafer. The wafer is then etched and given further treatment outside the scope of this invention.

This invention is directed towards the means and method of applying the photoresist material to the silicon wafer so that a surface of the photoresist material will be flat and within the depth of field of the objective lens. A projection system for projecting high resolution micro circuits upon photoresist material is disclosed in my copending applications Ser. 738,662, filed Mar. 14, 1968, for Micro Flash Camera Means.

It must be indicated that high resolution objectives provided with such a machine have limited depth of fields in the order of .0005″ or 12.5 microns. This means that images may be partly out of focus if the flatness deviates from this value as shown on the sketch (FIG. 2). This is encountered in the manufacture of circuits when multi-diffusion stops are utilized during the oven stages. In case of diced circuits, only a portion of the circuits are utilized. In the case of large memory arrays the entire arrays must be rejected in the event their resolution extends beyond that range. It must also be indicated that there are means to compensate for width line variations at the etching phase by controlling etching rate with temperature.

As indicated on FIGURE 2, the depth of field of .0005″ of one inch corresponds to 12.5 microns, while the photoresist thickness lies within a one micron band. Silicon wafers exhibiting surface anomalies of surface deflections within 12.5 microns are acceptable for large matrices.

Accordingly a principal object of the invention is to provide new and improved means and methods for making micro circuits.

Another object of the invention is to provide new and improved means and methods for applying viscous photoresist material to a silicon wafer and controlling the thickness of the layer of photoresist material.

Another object of the invention is to provide new and improved means and methods for coating a silicon wafer with a controlled thickness of photoresist material.

Another object of the invention is to provide new and improved means and methods to control a thickness of an applied liquid layer on a base comprising motor means to spin said base in a horizontal plane, means to apply the liquid to the top of the spinning base, means to measure the thickness of the liquid layer, and means to control the speed of the spinning base in order to control the thickness of the layer.

Another of the invention is to provide new and improved means for applying a controlled thickness layer of photoresist material on a silicon wafer comprising means to apply the material in liquid form means to spin the wafer in a horizontal plane, a laser beam directed towards said layer, means to detect reflection said laser beam from one or more surfaces of said layer and means responsive to the thickness of said layer to control the spinning rate.

These and other objects of the invention will be apparent in the following specifications and drawings which:

The projecting of images directly onto silicon wafers is a somewhat different technique than the direct contact printing of images onto silicon wafers, and extreme care must be exercised. It is also advisable to keep the emulsion uniformity as close as possible to reduce absorption through the gelatin molecules.

It must be emphasized that the quality of the photoresist material is most important. Filtered solution must be used, particle control, and a spinning process must be incorporated. It is proposed to incorporate in this effort the following thickness control of the resist material.

This will be accomplished by utilizing an infrared coherent beam of radiation incident to the wafer at an angle close to the specific Bragg value near to the total extinction factor, which reflectance indice will be detected and its equivalent electrical value fed back to the spinning motor to control the thickness of the viscous film across the resist. For instance the critical angle of reflection can be set for the exact thickness desired.

The beam of coherent radiation utilized to measure the thickness of the photoresist films is a 6328A helium neon laser source, which spectral response being above the response of the photoresist itself provided a means of inspection which does not alter the structure bond of the centers to be sensitized by the ultraviolet radiation.

Figure 1:
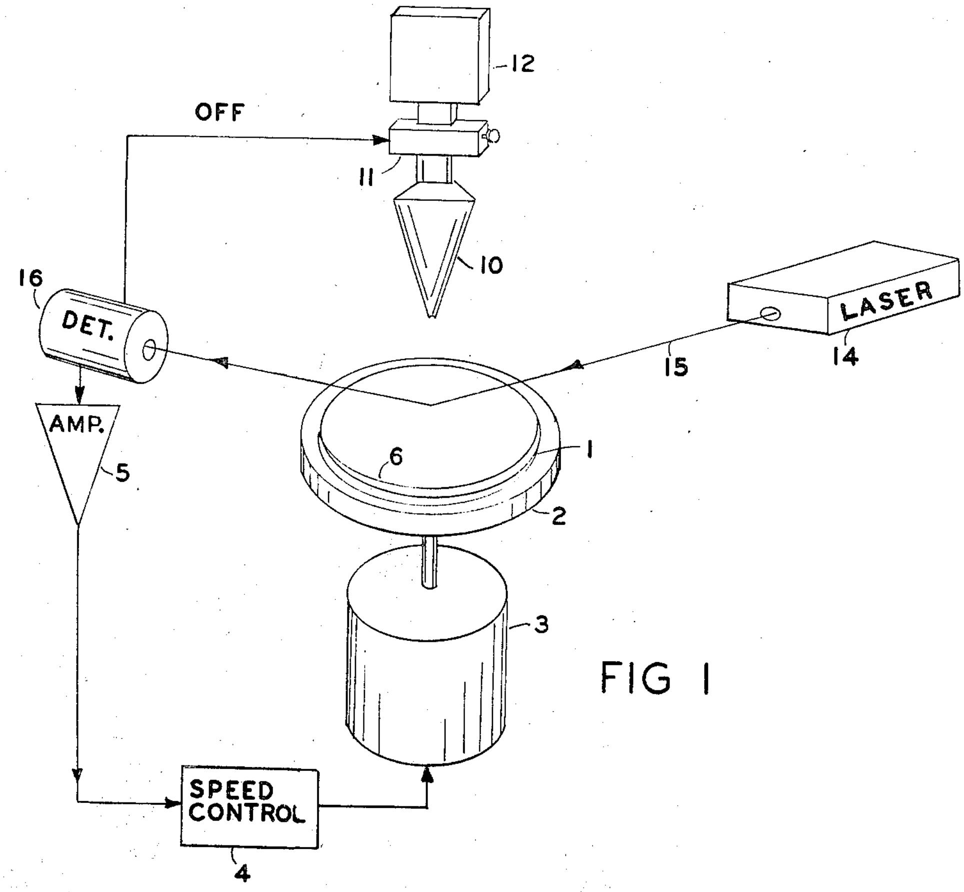
FIGURE 1 is a view of an embodiment of the invention.
Figure 2:
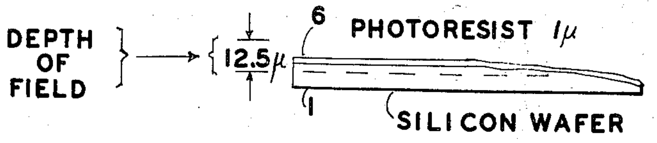
FIGURE 2 is a detail view illustrative of the invention.

More particularly referring to FIGURES 1 and 2 the silicon wafer or base 1 is mounted upon wheel 2 which is adapted to rotate in a horizontal plane. The motor 3 is adapted to spin the wheel 2 at a speed controlled by the speed controller 4 which in turn is controlled by the amplifier 5.

The input to the amplifier is proportional to the thickness of the material 6 being applied to the wafer or base 1. The photoresist material which forms the layer 6 is placed on a spinning base 1 by means of an automatic dropper apparatus 10 comprising tank 12 which is preferably adjusted by means of the valve 11 to form drops at uniform rate. The photoresist material viscosity and the speed of the spinning are chosen so that at the temperature of operation the material will spread gradually over the wafer of base 1 due to centrifugal force. It it is desired to spread the material thinly then the spinning is increased and vice versa.

In order to monitor the thickness of the material use is made of a laser beam source 14 which shoots a laser beam 15 on to the surface of material 6 at an angle.

The angle of incidence may be chosen near the critical angle of extinction so that the critical angle of reflections corresponds to the proper thickness.

The reflections off the top of the layer and/or the bottom of the layer are picked up by the detector 16 and are proportional to the thickness. For instance, the angle of incidence may be chosen so that the top and bottom reflections cancel out at the predetermined thickness or other equivalent phase relations may be set up for a given thickness and given angle. The valve 11 may be solenoid operated to shut off the supply at the proper thickness in response to the thickness detector means.

What is claimed is:

1. Means to control the thickness of an applied liquid layer of material on a base comprising, a wheel mounted to rotate in a horizontal plane said wheel being adapted to mount said base, means to apply said liquid to the top of said base, comprising a drop dispenser having a valve, motor means connected to spin said wheel, means to measure the thickness of said layer and means responsive to said measuring means to control the speed of said motor and said valve to thereby control the thickness of said layer.

2. Apparatus as in claim 1 wherein said measuring apparatus includes a source of beam energy and means to measure reflections of said energy from said layer.

3. Apparatus as in claim 1 wherein said measuring means comprise a source of radiant beam energy directed onto said layer and means to detect reflection of said energy, from the upper and lower surfaces.

4. Apparatus as in claim 3 wherein said energy beam is directed to said layer at an angle which is close to the extinction angle, so that the amount of reflection is proportional to the thickness of said material.

5. Apparatus as in claim 4 wherein said energy source is a laser.

6. Apparatus as in claim 5 wherein said liquid layer is a photoresist material and said laser is an hellium neon laser having a frequency outside of the response frequency band of the photoresist material.

References Cited

UNITED STATES PATENTS

| | | | |
|---|---|---|---|
| 1,907,803 | 5/1933 | Harvey et al. | 88—14 X |
| 2,146,285 | 2/1939 | Corbett | 117—101 X |
| 3,016,464 | 1/1962 | Bailey. | |
| 3,198,657 | 8/1965 | Kimball et al. | 117—101 |
| 3,287,564 | 11/1966 | Gore et al. | 250—222 |
| 3,307,446 | 3/1967 | Rottmann. | |
| 3,319,515 | 5/1967 | Flournoy. | |

OTHER REFERENCES

J. Gow III et al.: "Thin-Film Gauging Device," IBM Technical Disclosure Bulletin, vol. 8, No. 11, April 1966, p. 1584.

RALPH G. NILSON, Primary Examiner

C. M. LEEDOM, Assistant Examiner

U.S. Cl. X.R.

117—101; 356—161